(12) United States Patent
Malecke et al.

(10) Patent No.: US 10,638,623 B2
(45) Date of Patent: Apr. 28, 2020

(54) SEALED ELECTRONIC CONTROL MODULE

(71) Applicant: VEONEER US INC., Southfield, MI (US)

(72) Inventors: Floyd J. Malecke, South Lyon, MI (US); Luis F. Sanchez, Commerce Township, MI (US)

(73) Assignee: VEONEER US INC., Southfield, MI (US)

(*) Notice: Subject to any disclaimer, the term of this patent is extended or adjusted under 35 U.S.C. 154(b) by 0 days.

(21) Appl. No.: 15/925,033

(22) Filed: Mar. 19, 2018

(65) Prior Publication Data
US 2019/0289728 A1 Sep. 19, 2019

(51) Int. Cl.
H05K 5/00 (2006.01)
H05K 13/00 (2006.01)
H05K 5/02 (2006.01)

(52) U.S. Cl.
CPC ......... H05K 5/0095 (2013.01); H05K 5/0004 (2013.01); H05K 5/0217 (2013.01); H05K 13/00 (2013.01); H05K 13/0015 (2013.01)

(58) Field of Classification Search
CPC .. H05K 5/0095; H05K 5/0004; H05K 5/0217; H05K 13/0015
See application file for complete search history.

(56) References Cited

U.S. PATENT DOCUMENTS

| 4,212,415 | A | * | 7/1980 | Neely | B65D 11/10 220/324 |
|---|---|---|---|---|---|
| 4,896,784 | A | * | 1/1990 | Heath | H02G 3/14 174/53 |
| 5,699,601 | A | * | 12/1997 | Gilliam | B25B 27/00 29/278 |
| 5,979,691 | A | * | 11/1999 | Von Holdt | B65D 43/0256 220/266 |
| 9,061,566 | B2 | * | 6/2015 | Hoehn | F16B 5/0012 |
| 10,098,247 | B2 | * | 10/2018 | Tashiro | B60R 16/0238 |
| 2002/0112870 | A1 | | 8/2002 | Kobayashi et al. | 174/50 |
| 2013/0328461 | A1 | * | 12/2013 | Chung | H05K 5/0221 312/223.1 |
| 2014/0085839 | A1 | * | 3/2014 | Nakano | H05K 5/0052 361/752 |
| 2015/0077956 | A1 | | 3/2015 | Sano | |
| 2015/0145390 | A1 | * | 5/2015 | Schwab | H05K 5/0004 312/236 |
| 2015/0201505 | A1 | * | 7/2015 | Hu | H05K 5/0013 312/223.1 |
| 2015/0208529 | A1 | * | 7/2015 | Sakong | G06F 1/1601 361/679.01 |

(Continued)

FOREIGN PATENT DOCUMENTS

CN 2038966934 10/2014

Primary Examiner — Daniel P Wicklund
Assistant Examiner — Christopher L Augustin
(74) Attorney, Agent, or Firm — Christopher P. Maiorana, PC

(57) ABSTRACT

An apparatus includes an upper housing, a gasket, and a lower housing. The upper housing generally comprises a plurality of tabs and a plurality of threaded sockets. The lower housing generally comprises a plurality of openings configured to engage the tabs of the upper housing and a plurality of holes configured to align with the plurality of threaded sockets when assembled to the upper housing.

20 Claims, 18 Drawing Sheets

(56) References Cited

U.S. PATENT DOCUMENTS

| | | | |
|---|---|---|---|
| 2015/0289399 A1* | 10/2015 | Liao | H05K 7/1417 |
| | | | 361/747 |
| 2015/0351262 A1* | 12/2015 | Jorgensen | H05K 5/0039 |
| | | | 312/223.1 |
| 2016/0150658 A1* | 5/2016 | Tsukahara | G09F 7/18 |
| | | | 361/679.01 |
| 2017/0181298 A1* | 6/2017 | Ahrens | H05K 5/0008 |
| 2017/0265318 A1* | 9/2017 | Taubert | H05K 5/0073 |
| 2017/0290173 A1* | 10/2017 | Shoji | H05K 5/0008 |
| 2019/0067924 A1* | 2/2019 | Aichi | H02G 3/081 |

\* cited by examiner

SEALED ELECTRONIC CONTROL MODULE

FIELD OF THE INVENTION

The invention relates to automotive control assemblies generally and, more particularly, to a method and/or apparatus for implementing a sealed electronic control module.

BACKGROUND

The automotive industry requires a restraint control module be sealed to the environment in some applications. International Electrotechnical Commission (IEC) standard 60529, Degrees of Protection Provided by Enclosures (IP Codes)," Ed. 2.2 (Geneva: International Electrotechnical Commission, 2013), classifies the degrees of protection provided against the intrusion of solid objects (including body parts like hands and fingers), dust, accidental contact, and water in electrical enclosures. The standard aims to provide users more detailed information than vague marketing terms such as waterproof. The automotive industry requirements vary from sealing a module from a light water spray (e.g., IP 53) to complete immersion to a depth of 1 meter for 30 minutes (e.g., IP 67/68). In some applications customers require sealing to pressures up to 6 psi (e.g., IP 68). In some cases the pressure differential is created due to a customer requirement to preheat the module to 85° C. prior to conducting the water spray or immersion testing.

It would be desirable to implement a sealed electronic control module.

SUMMARY

The invention concerns an apparatus including an upper housing, a gasket, and a lower housing. The upper housing generally comprises a plurality of tabs and a plurality of threaded sockets. The lower housing generally comprises a plurality of openings configured to engage the tabs of the upper housing and a plurality of holes configured to align with the plurality of threaded sockets when assembled to the upper housing.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a sealed electronic control module that may (i) utilize two fastener types to secure case halves to one another to provide a secure seal, (ii) utilize a two-step assembly process that simplifies manufacturing, (iii) meet automotive standards for sealing control modules against fluid penetration (e.g., IP 67/68), (iv) eliminate the dispensing of sealants or adhesives during the manufacturing process, and/or (v) be implemented in any control module case comprising two halves.

In various embodiments, a molded elastomer gasket is utilized to create the seal between upper and lower portions of a housing enclosing an electronic control module. In some embodiments, the gasket may be comprised of nitrile rubber. In some embodiments, the gasket may comprise silicone rubber. In an example embodiment, the gasket may comprise a material having a durometer rating in a range from 30 to 100. However, other materials may used to meet the design criteria of a particular implementation. In some embodiments, the gasket may be implemented as an individual component. In some embodiments, the gasket may comprise a circular cross-section. In some embodiments, the gasket may comprise an L-shaped cross-section. In some embodiments, the seal may be implemented as an elastomer gasket that is over molded to an adjacent component (housing, cover, etc).

Another feature of the invention is to integrate a snap fit design in the enclosure to help provide clamping force to the gasket and hold adjacent components in alignment while threaded fasteners are used for final assembly. Also to improve the sealing of the module, in some embodiments the threaded fasteners used to assemble the enclosure are located outside the seal to avoid a need for sealing the fasteners. Additionally, in various embodiments the invention includes the use of a connector integrated into the enclosure to avoid the necessity to seal the interface between the connector and the enclosure.

Figure 1:
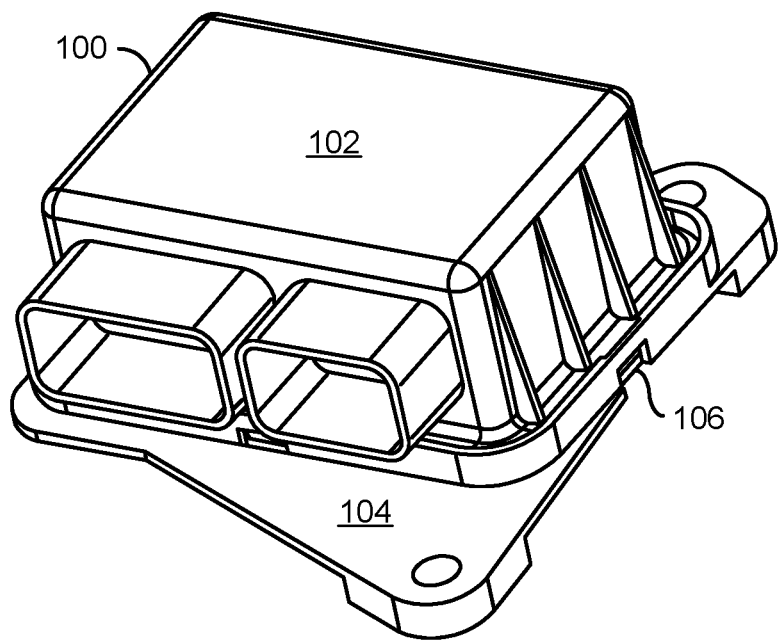
FIG. 1 is a diagram illustrating a perspective view of an upper surface of an assembled sealed electronic control module housing in accordance with an example embodiment of the invention.

Referring to FIG. 1, a diagram is shown illustrating a perspective view of an upper surface of an assembled sealed electronic control module housing 100 in accordance with an example embodiment of the invention. In various embodiments, the housing (or enclosure) 100 comprises an upper housing 102 and a lower housing (or cover or baseplate) 104. The upper housing 102 generally includes a plurality of tabs 106 distributed around a lower edge of the upper housing 102. The tabs 106 are generally configured to engage openings in the lower housing 104 to provide a snap fit that provides clamping force to a gasket between the upper housing 102 and the lower housing 104 (not shown). When engaged, the tabs 106 also hold the upper housing 102, the lower housing 104, and the gasket there between in alignment while threaded fasteners are inserted during a final assembly step.

In various embodiments, the upper housing 102 generally comprises a plastic or resin based material. In various embodiments, the plastic material may include, but is not limited to polyamide (NYLON), polybutylene terephthalate (PBT), polypropylene, polyethylene terephthalate (PET), acrylonitrile butadiene styrene (ABS), and/or various alloys and/or fillers of these resins. In various embodiments, the upper housing 102 generally includes one or more connectors integrated into the housing. Molding or otherwise incorporating the connectors as part of the enclosure (housing) eliminates the need for sealing the connector/housing interface. In an example, the upper housing 102 may incorporate a 72 pin connector and a 52 pin connector to provide electrical connections to a circuit board sealed within the enclosure 100. In an example, the connectors may be implemented as 1.8 mm pitch Nano connectors. In an example, the enclosure 100 and the enclosed circuit board may implement a sealed restraint control module that can meet international standards for intrusion protection (e.g., an IP 67 Intrusion Protection Rating as specified in International Electrotechnical Commission (IEC) standard 60529).

Figure 2:
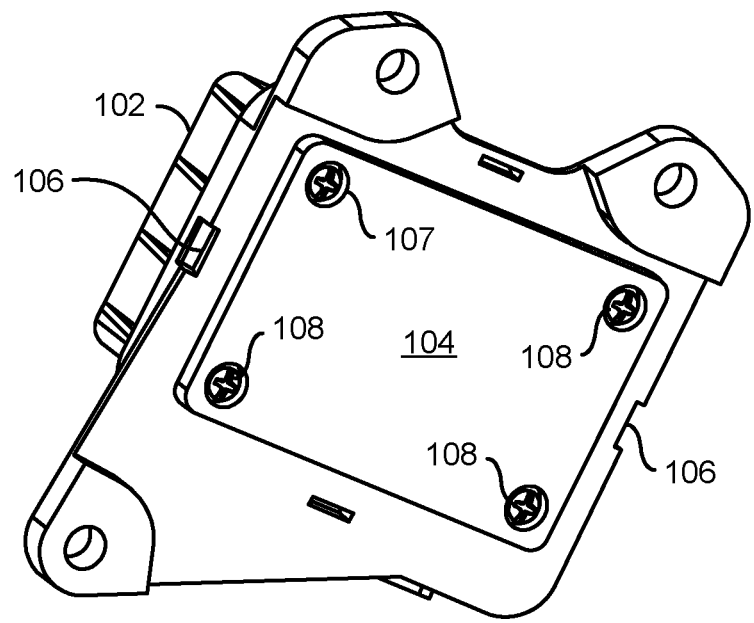
FIG. 2 is a diagram illustrating a perspective view of a lower surface of the assembled sealed electronic control module housing of FIG. 1.

Referring to FIG. 2, a diagram is shown illustrating a perspective view of a lower surface of the assembled sealed electronic control module housing 100 of FIG. 1. In an example, the lower housing (or cover or baseplate) 104 may be implemented as a die cast Aluminum baseplate. In another example, the lower housing (or cover or baseplate) 104 may be implemented as a stamped steel baseplate. Implementing the lower housing 104 with a metallic material may aid in dissipating heat generated by circuitry within the seated enclosure 100. In various embodiments, the lower housing 104 may be machined to create a sealing surface against which a gasket placed between the upper housing 102 and the lower housing 104 may form a seal when the upper housing 102 and the lower housing 104 are pressed together. The lower housing 104 is generally configured to provide a mounting footprint for the sealed electronic control module housing 100. In an example, the lower housing 104 may be implemented with an RCM8 mounting footprint to simplify testing. However, other footprints may be implemented to meet the design criteria of a particular application.

In various embodiments, the lower housing (or cover or baseplate) 104 comprises a plurality of holes 107 through which threaded fasteners (e.g., screws) 108 may be inserted to securely assemble the upper housing 102 to the lower housing 104. In various embodiments, a predefined amount of torque is applied to the threaded fasteners 108 to perfect the desired clamping force on a sealing gasket disposed between the upper housing 102 and the lower housing 104. In an example, the threaded fasteners 108 may be tightened (torqued) to provide a clamping force of 67 N per screw.

Figure 3:
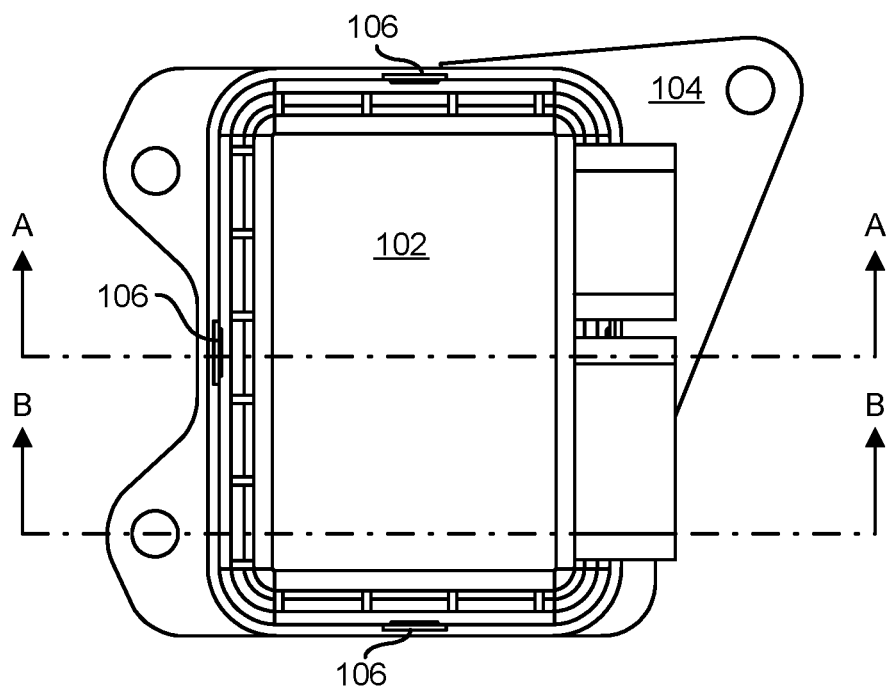
FIG. 3 is a diagram illustrating a top view of the assembled sealed electronic control module housing of FIG. 1.

Referring to FIG. 3, a diagram is shown illustrating a top view of the assembled sealed electronic control module housing 100 of FIG. 1. In various embodiments, a plurality of tabs 106 are distributed around a lower edge of the upper housing 102 to provide alignment and to provide substantially equal clamping force around a periphery of the upper housing 102. In an example, the upper housing 102 may have four side faces and each side face may have a tab 106 centrally located at the lower edge. However, additional tabs 106 may be implemented depending on the dimensions of a particular implementation.

Figure 4:
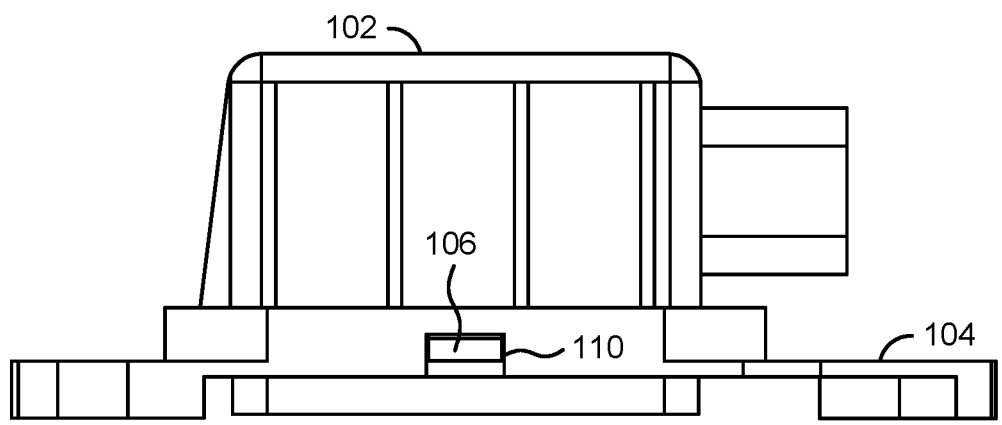
FIG. 4 is a diagram illustrating a side view of the assembled sealed electronic control module housing of FIG. 1.

Referring to FIG. 4, a diagram is shown illustrating a side view of the assembled sealed electronic control module housing 100 of FIG. 1. In various embodiments, the lower housing 104 comprises a plurality of openings 110. The openings 110 are generally located to match positions of the tabs 106 on the upper housing 102. When the upper housing 102 is assembled to the lower housing 104, the tabs 106 of the upper housing 102 engage the openings 110 of the lower housing 104 to provide the snap fit that provides a first amount of compressive force to the sealing gasket disposed between the upper housing 102 and the lower housing 104 (described below in connection with FIGS. 5 and 6). The first amount of compressive force generally provides a minimum seal against fluid penetration past the gasket. In various embodiments, the first amount of compressive force provided by the snap fit may be sufficient to meet the international standards for intrusion protection (e.g., International Electrotechnical Commission (IEC) standard 60529).

Figure 5:
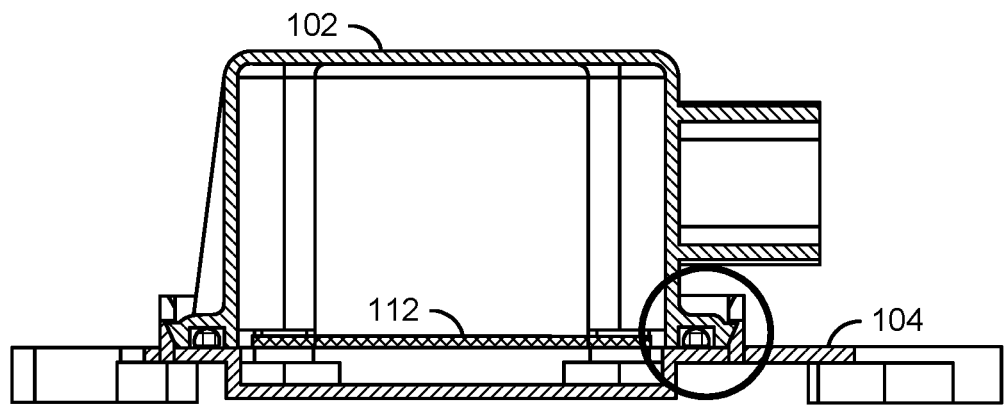
FIG. 5 is a cross-sectional view illustrating a section A-A of the assembled sealed electronic control module housing of FIG. 3 with a gasket in accordance with an example embodiment of the invention.
Figure 6:
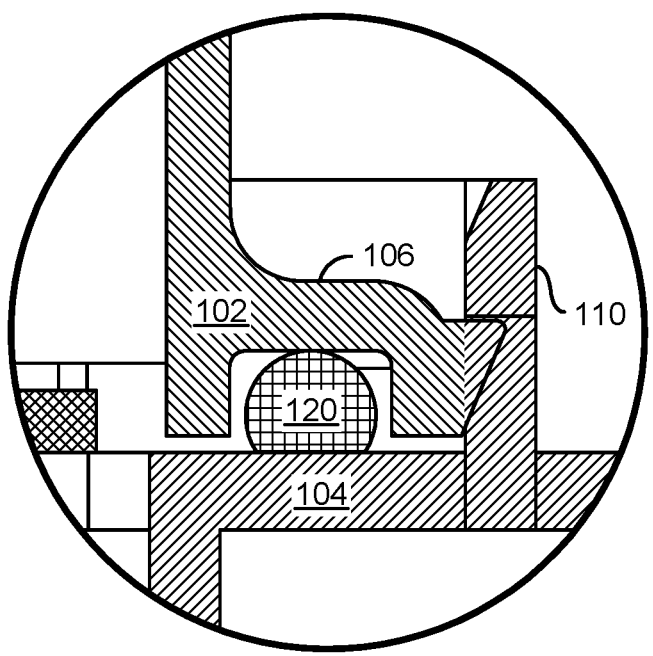
FIG. 6 is a diagram illustrating an enlarged view of a tab feature of the assembled sealed electronic control module housing of FIG. 5.

Referring to FIGS. 5 and 6, a cross-sectional view is shown illustrating a section A-A of the assembled sealed electronic control module housing 100 of FIG. 3 with a gasket in accordance with an example embodiment of the invention. In various embodiments, the sealed electronic control module housing 100 is configured to provide an enclosed sealed space in which a circuit board 112 may be securely mounted. In various embodiments, the circuit board 112 may be configured to implement the circuitry of the electronic control module. In an example, the circuit board 112 may be a printed circuit board substrate having one or more integrated circuits implementing a restraint control module design. In an example, the upper housing 102 generally includes a groove in which an elastomer gasket 120 may be placed to form a seal between the upper housing 102 and the lower housing 104. When the upper housing 102, the lower housing 104, and the gasket 120 are assembled and pressed together, the tabs 106 of the upper housing 102 engage the openings 110 in the lower housing 104 locking the upper housing 102 and the lower housing 104 together and applying a first compressive force to the gasket 120.

Referring to FIG. 6, a diagram is shown illustrating an enlarged view of a tab feature of the assembled sealed electronic control module housing 100 of FIG. 5. In an example, the gasket 120 may comprise a circular cross-section. However, other gasket cross-sections may be implemented to meet design criterial of a particular implementation.

Figure 7:
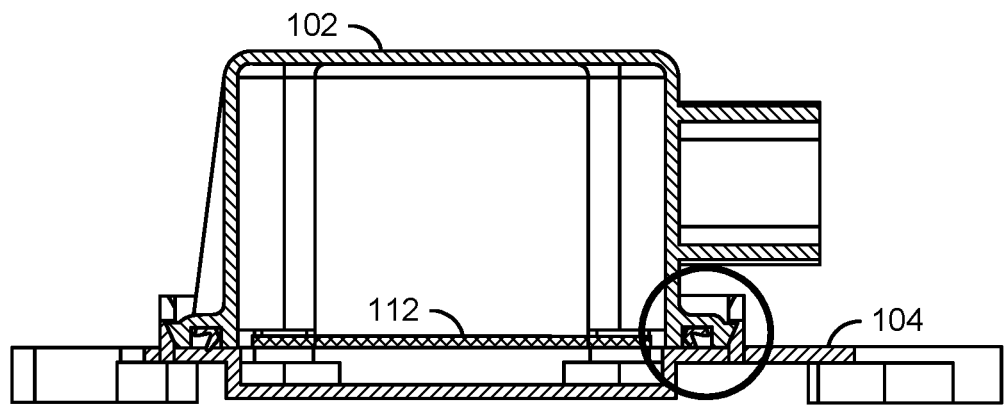
FIG. 7 is a cross-sectional view illustrating a section A-A of the assembled sealed electronic control module housing of FIG. 3 with a gasket in accordance with another example embodiment of the invention.
Figure 8:
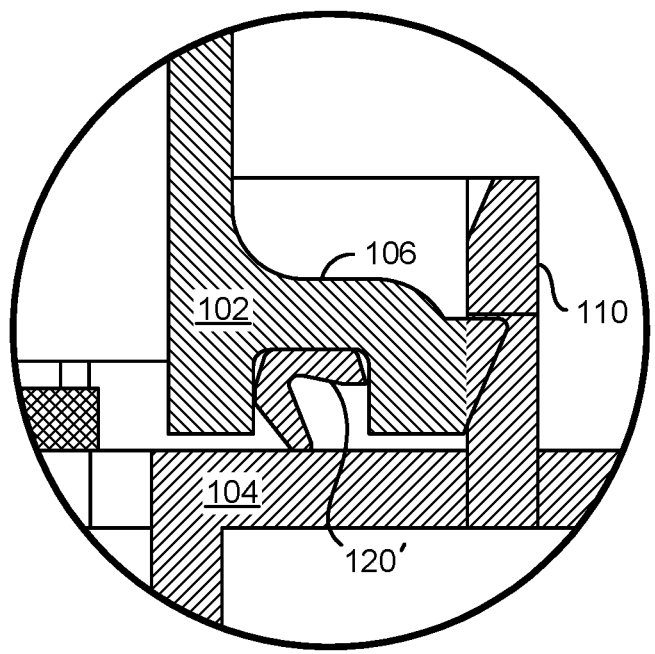
FIG. 8 is a diagram illustrating an enlarged view of a tab feature of the assembled sealed electronic control module housing of FIG. 7.

Referring to FIGS. 7 and 8, a cross-sectional view is shown illustrating a section A-A of the assembled sealed electronic control module housing 100 of FIG. 3 with a gasket in accordance with another example embodiment of the invention. In various embodiments, the sealed electronic control module housing 100 is configured to provide an enclosed sealed space in which a circuit board 112 may be securely mounted. In various embodiments, the circuit board 112 may be configured to implement the circuitry of the electronic control module. In an example, the circuit board 112 may be a printed circuit board substrate having one or more integrated circuits implementing a restraint control module design. In an example, the upper housing 102 generally includes a groove in which an elastomer gasket 120' may be placed to form a seal between the upper housing 102 and the lower housing 104. When the upper housing 102, the lower housing 104, and the gasket 120' are assembled and pressed together, the tabs 106 of the upper housing 102 engage the openings 110 in the lower housing 104 locking the upper housing 102 and the lower housing 104 together and applying a first compressive force to the gasket 120'.

Referring to FIG. 8, a diagram is shown illustrating an enlarged view of a tab feature and example gaskets of the assembled sealed electronic control module housing 100 of FIG. 7. In an example, the gasket 120' may comprise an approximately L-shaped cross-section configured to provide a lip seal. However, other gasket cross-sections may be implemented to meet design criterial of a particular implementation.

Figure 9:
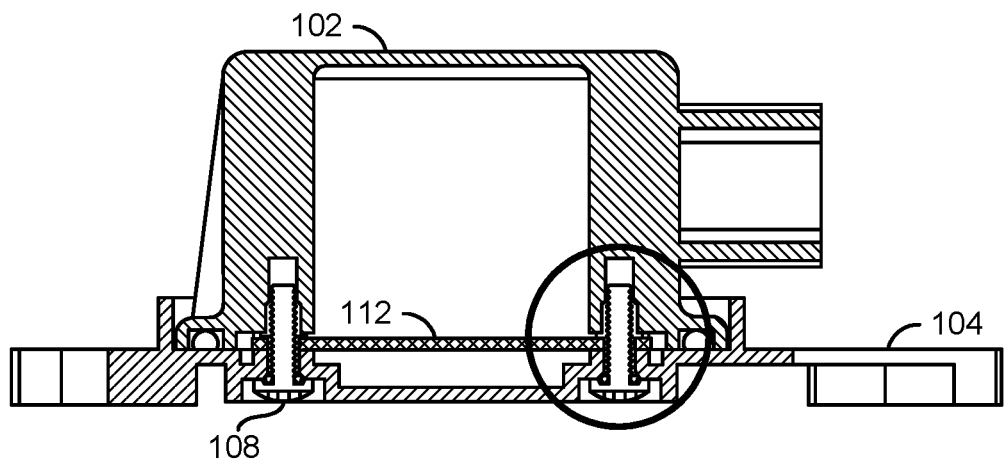
FIG. 9 is a cross-sectional view illustrating a section B-B of the assembled sealed electronic control module housing of FIG. 3.
Figure 10:
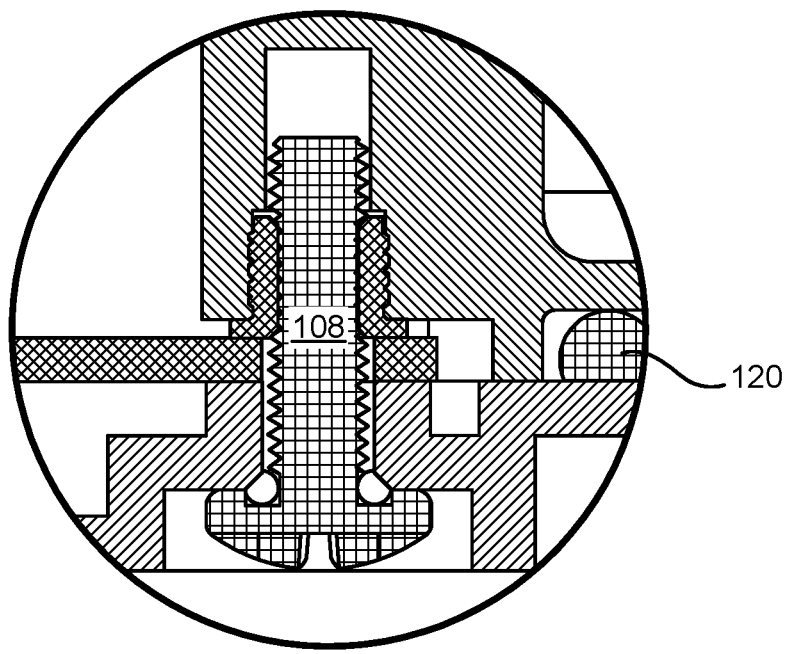
FIG. 10 is a diagram illustrating an enlarged view of a screw fastener feature of the assembled sealed electronic control module housing of FIG. 9.

Referring to FIGS. 9 and 10, a cross-sectional view is shown illustrating a section B-B of the assembled sealed electronic control module housing 100 of FIG. 3. In some embodiments, the threaded fasteners 108 are located within the gasket 120. In an example, the threaded fasteners 108 may be inserted through the holes 107 in the lower housing 104, through holes in the circuit board 112, and into threaded sockets in the upper housing 102. When the threaded fasteners are located within the gasket 120, the threaded fasteners include a seal (e.g., an O-ring) to prevent fluid penetration into the sealed space within the module housing 100. In an example, the threaded sockets in the upper housing 102 may be formed by inserting threaded inserts into holes in the upper housing 102. In an example, the threaded inserts may comprise metal (e.g., brass, aluminum, etc.) inserts. In an example, the threaded inserts may be configured (e.g., splined, barbed, threaded, etc.) to allow the inserts to be retained in the upper housing 102.

Referring to FIG. 10, a diagram is shown illustrating an enlarged view of the threaded fastener feature of the assembled sealed electronic control module housing 100 of FIG. 9 in accordance with an example embodiment of the invention.

Figure 11:
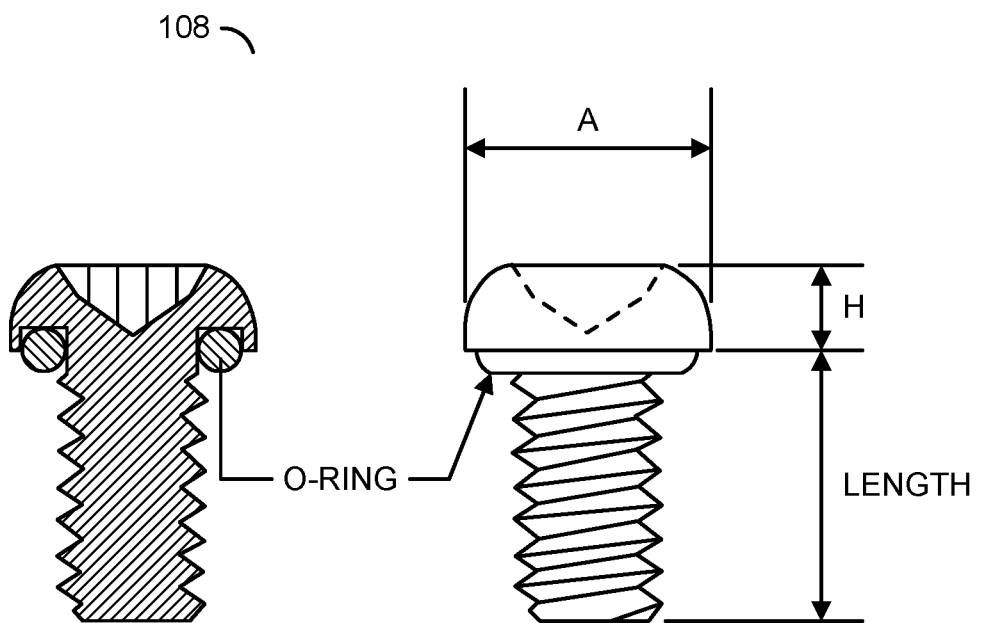
FIG. 11 is a diagram illustrating features of the screw fastener of FIGS. 9 and 10.

Referring to FIG. 11, a diagram is shown illustrating features of the threaded fastener 108 of FIGS. 9 and 10. In an example, the threaded fastener 108 may be implemented as a pan head machine screw with an integrated o-ring. In an example, the threaded fastener 108 may comprise an M3.5× 13 Phillips pan head self-sealing screw. A height (H) of the head of the threaded fasteners 108 are generally configured to be flush with an outside surface of the lower housing 104. A length of the threaded fasteners is generally configured to ensure a sufficient amount of threads are in the upper housing 102 to provide a desired holding force.

Figure 12:
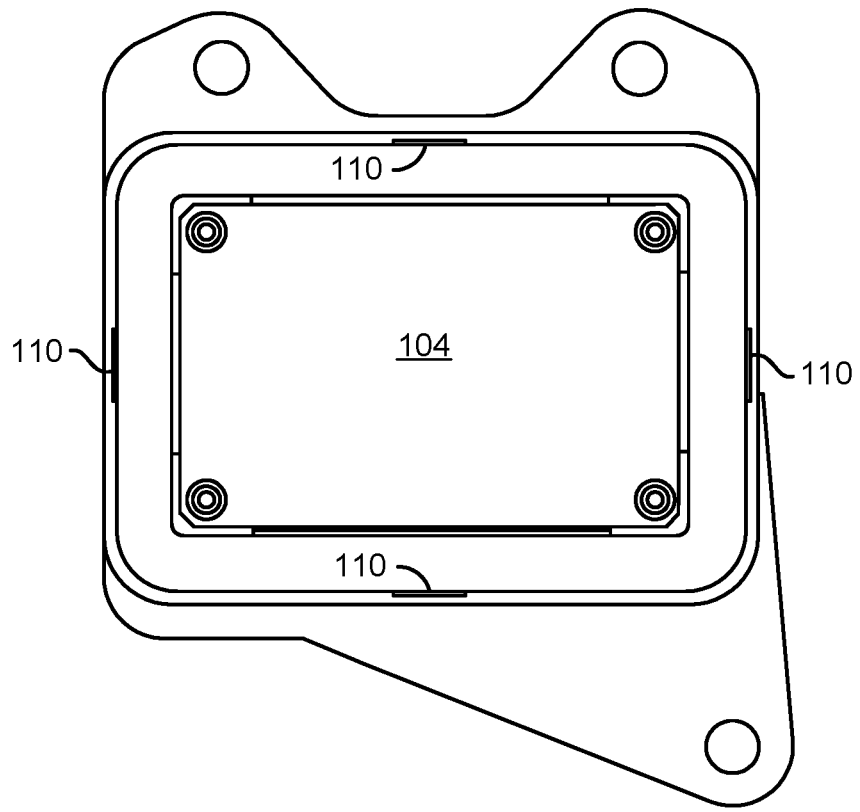
FIG. 12 is a diagram illustrating an inner surface of a lower portion of the sealed electronic control module housing of FIG. 1.

Referring to FIG. 12, a diagram is shown illustrating the circuit board 112 mounted to an inner surface of the lower portion of the sealed electronic control module housing 100 of FIG. 1. In an example, the lower housing 104 may be configured to allow the circuit board 112 to be mounted to the inner surface. In an example, the lower housing 104 may comprise a number of studs to which the circuit board 112 may be configured to be press fit. The press fit may hold the circuit board 112 in position while the sealed electronic control module housing is assembled and snapped together, and the threaded fasteners are inserted and torqued.

Figure 13:
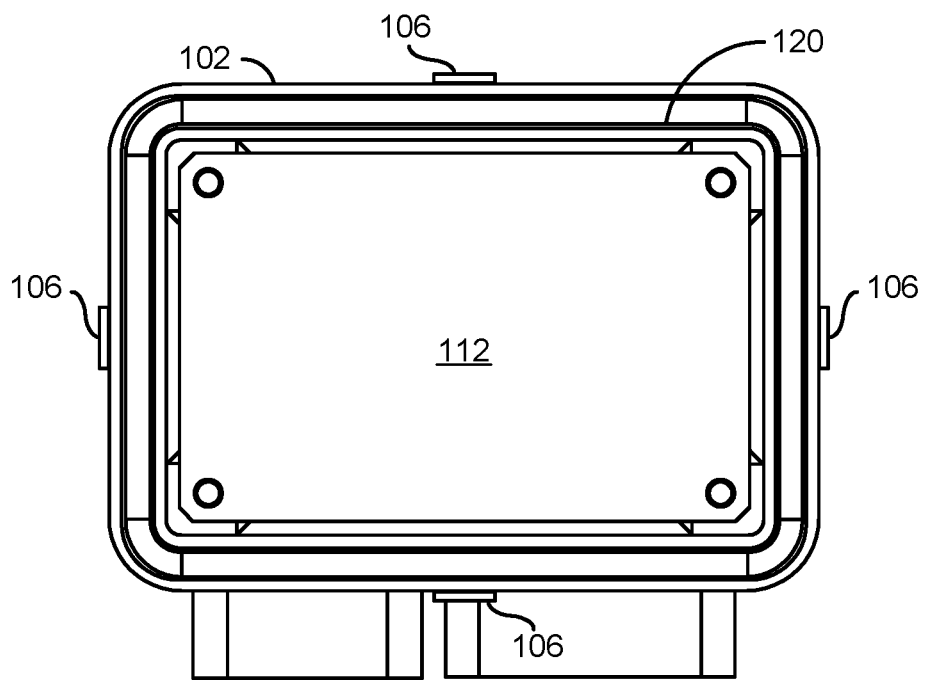
FIG. 13 is a diagram illustrating a circuit board mounted within an upper portion of the sealed electronic control module housing of FIG. 1.

Referring to FIG. 13, a diagram is shown illustrating the circuit board 112 mounted within the upper portion of the sealed electronic control module housing 100 of FIG. 1. In another example, the upper housing 102 may be configured to allow the circuit board 112 to be mounted to the inside of the upper housing 102. In an example, the upper housing 102 may comprise a number of studs to which the circuit board 112 may be configured to be press fit. The press fit may hold the circuit board 112 in position in the upper housing 102 while the sealed electronic control module housing 100 is assembled and snapped together, and the threaded fasteners are inserted and torqued.

Figure 14:
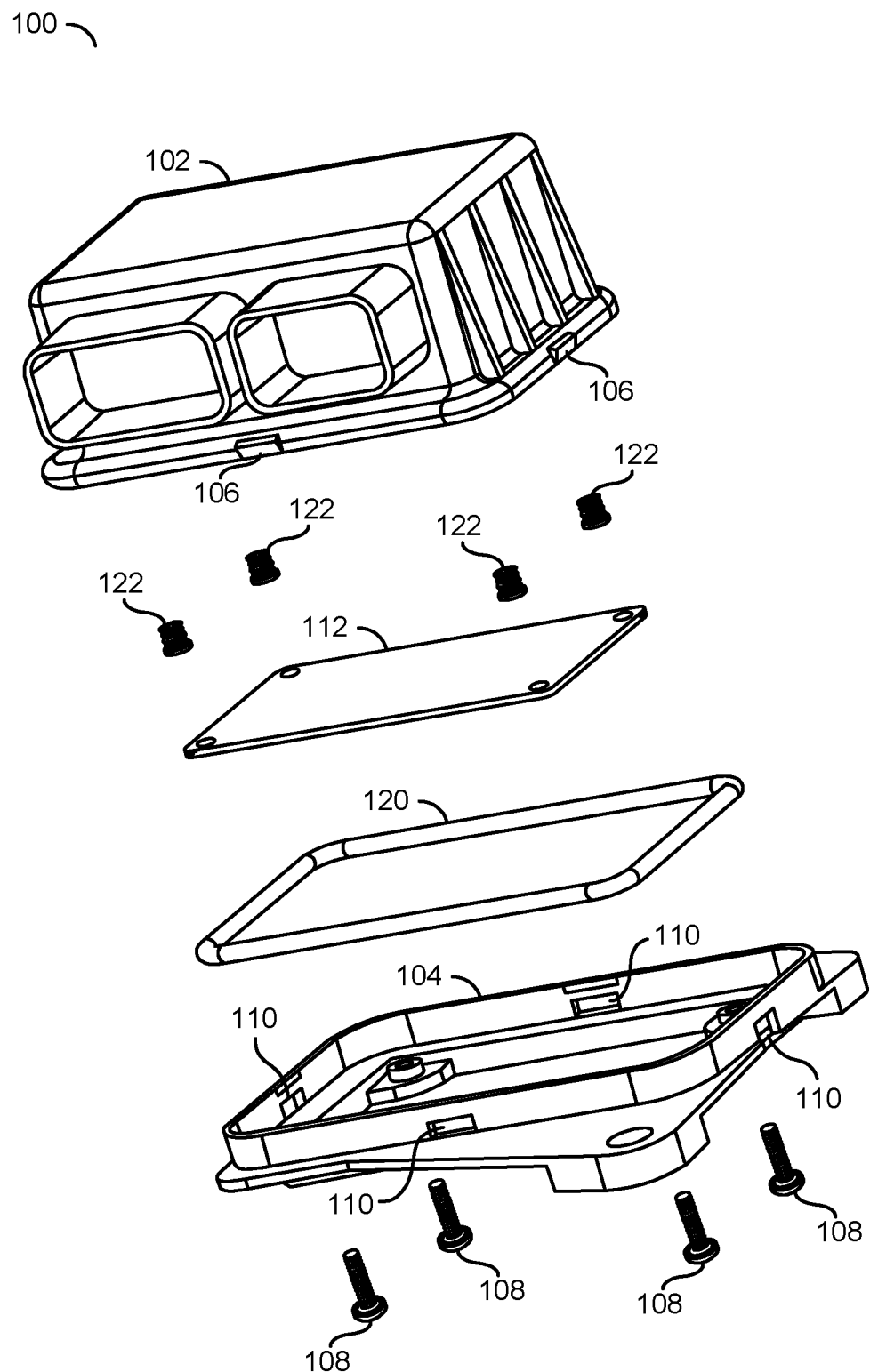
FIG. 14 is a diagram illustrating an exploded view of the sealed electronic control module housing of FIG. 1 with a circuit board.

Referring to FIG. 14, a diagram is shown illustrating an exploded view of the sealed electronic control module housing 100 of FIG. 1 with a circuit board. In an example, assembly of the sealed electronic control module housing 100 may comprise inserting threaded inserts 122 into recesses in the upper housing 102, attaching the circuit board 112 to either the upper housing 102 or the lower housing 104, placing the gasket 120 around the circuit board 112 (e.g., in a groove in the upper housing 102 and/or lower housing 104), assembling the upper housing 102 and lower housing 104 with a snap fit to engage the tabs 106 in the openings 110 and apply a first amount of compressive force to the gasket 120, and inserting the threaded fasteners 108 and tightening the threaded fasteners 108 to apply a second amount of compressive force to the gasket 120 to perfect the seal provided by the sealed electronic control module housing 100.

Figure 15:
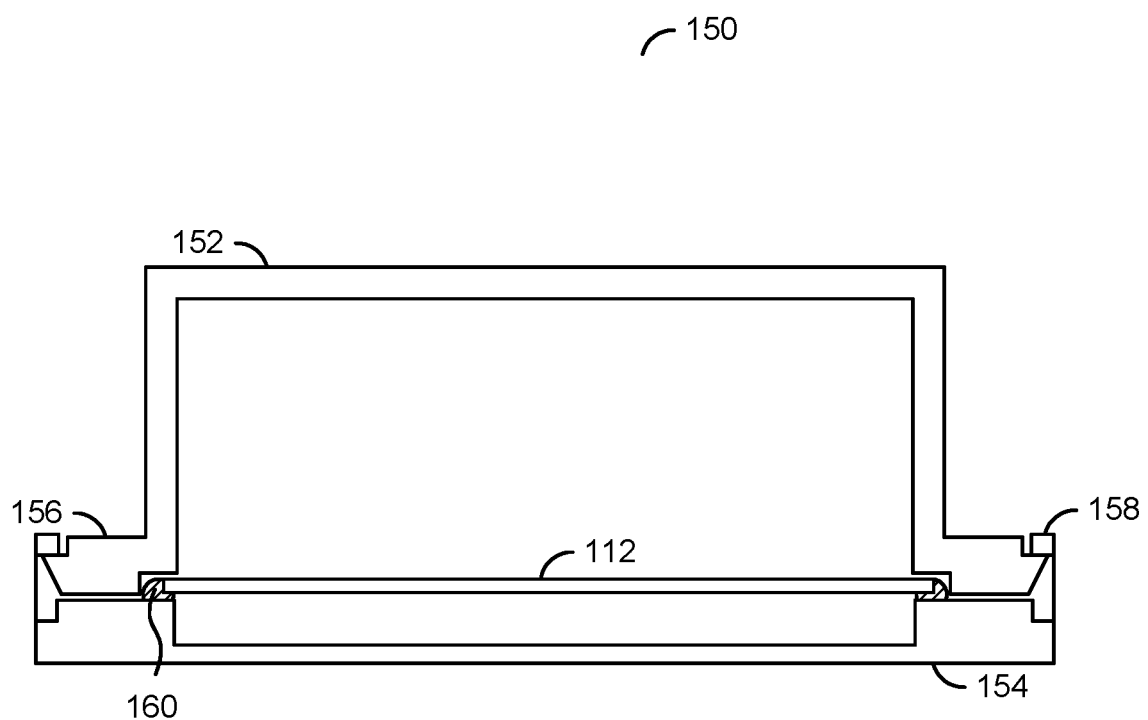
FIG. 15 is a diagram illustrating a snap fit housing assembly in accordance with another example embodiment of the invention.

Referring to FIG. 15, a diagram is shown illustrating a snap fit housing assembly 150 in accordance with another example embodiment of the invention. In an example, the snap fit housing assembly 150 may comprise an upper housing 152 and a lower housing 154. The upper housing 152 may include tabs 156. The lower housing 154 may include a feature 158 configured to form the snap fit with the tabs 156. A silicone bead 160 may be dispensed along a surface or a recess or groove (e.g., a rabbet) in the lower housing 154. The circuit board 112 may be placed in contact with the silicone bead 160. The upper housing 152 and the lower housing 154 may be aligned such that a recess or groove (e.g., a rabbet) in the upper housing 152 encompasses an edge of the circuit board 112 and the silicone bead 160. The upper housing 152 and the lower housing 154 may be pressed together until the tabs 156 engage the features 158. The application of the silicone bead 160 between the upper housing 152, the lower housing 154, and the circuit board 112 may provide benefits with respect to a mechanical transfer function (MTF) of the assembled unit.

Figure 16:
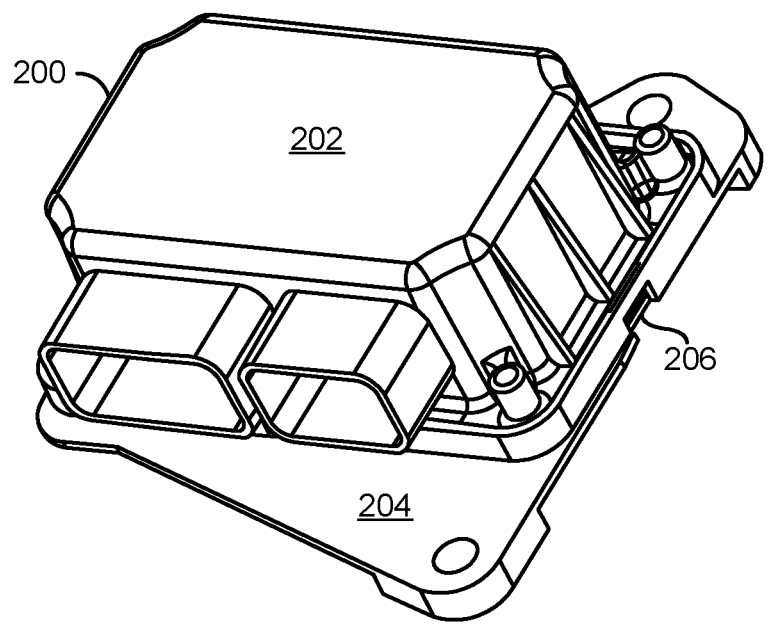
FIG. 16 is a diagram illustrating a perspective view of an upper surface of an assembled sealed electronic control module housing in accordance with another example embodiment of the invention.

Referring to FIG. 16, a diagram is shown illustrating a perspective view of an upper surface of an assembled sealed electronic control module housing 200 in accordance with another example embodiment of the invention. In various embodiments, the housing (or enclosure) 200 comprises an upper housing 202 and a lower housing (or cover or baseplate) 204. The upper housing 202 generally includes a plurality of tabs 206 distributed around a lower edge of the upper housing 202. The tabs 206 are generally configured to engage openings in the lower housing 204 to provide a snap fit that provides clamping force to a gasket between the upper housing 202 and the lower housing 204 (not shown). When engaged, the tabs 206 also hold the upper housing 202, the lower housing 204, and the gasket there between in alignment while threaded fasteners are inserted during a final assembly step.

In various embodiments, the upper housing generally includes one or more connectors integrated into the housing. Molding or otherwise incorporating the connectors as part of the enclosure (housing) eliminates the need for sealing the connector/housing interface. In an example, the upper housing 202 may incorporate a 72 pin connector and a 52 pin connector to provide electrical connections to a circuit board sealed within the enclosure 200. In an example, the connectors may be implemented as 1.8 mm pitch Nano connectors. In an example, the enclosure 200 and the enclosed circuit board may implement a sealed restraint control module that can meet international standards for intrusion protection (e.g., an IP 67 Intrusion Protection Rating as specified in International Electrotechnical Commission (IEC) standard 60529).

Figure 17:
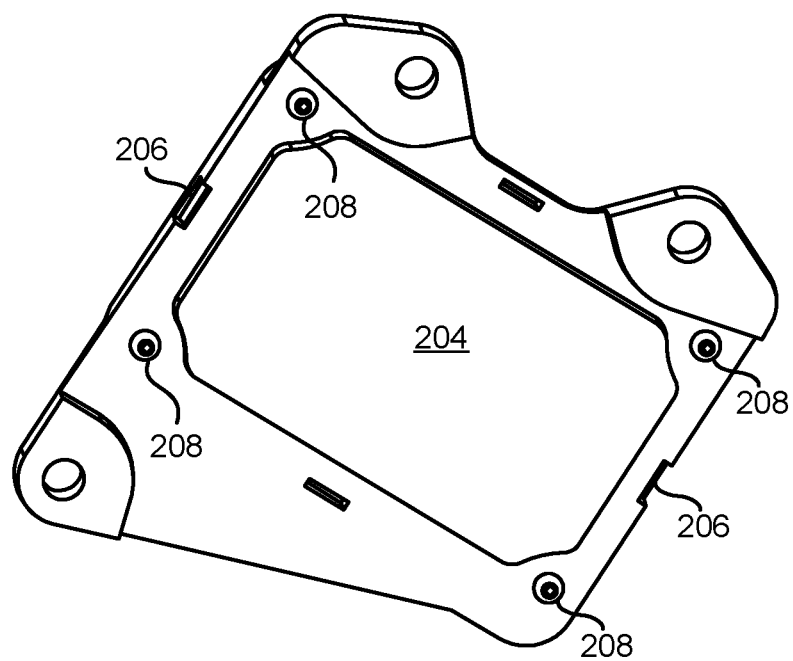
FIG. 17 is a diagram illustrating a perspective view of a lower surface of the assembled sealed electronic control module housing of FIG. 16.

Referring to FIG. 17, a diagram is shown illustrating a perspective view of a lower surface of the assembled sealed electronic control module housing 200 of FIG. 16. In an example, the lower housing (or cover or baseplate) 204 may be implemented as a die cast aluminum baseplate. In another example, the lower housing (or cover or baseplate) 204 may be implemented as a stamped steel baseplate. In various embodiments, the lower housing 204 may be machined to create a sealing surface against which a gasket placed between the upper housing 202 and the lower housing 204 may form a seal when the upper housing 202 and the lower housing 204 are pressed together. The lower housing 204 is generally configured to provide a mounting footprint for the sealed electronic control module housing 200. In an example, the lower housing 204 may be implemented with an RCM8 mounting footprint to simplify testing. However, other footprints may be implemented to meet the design criteria of a particular application.

In various embodiments, the lower housing (or cover or baseplate) 204 comprises a plurality of holes through which threaded fasteners (e.g., screws) 208 may be inserted to securely assemble the upper housing 202 to the lower housing 204. In various embodiments, a predefined amount of torque is applied to the threaded fasteners 208 to perfect the desired clamping force on the gasket disposed between the upper housing 202 to the lower housing 204. In an example, the threaded fasteners 208 may be tightened (torqued) to provide a clamping force of 67 N per screw.

Figure 18:
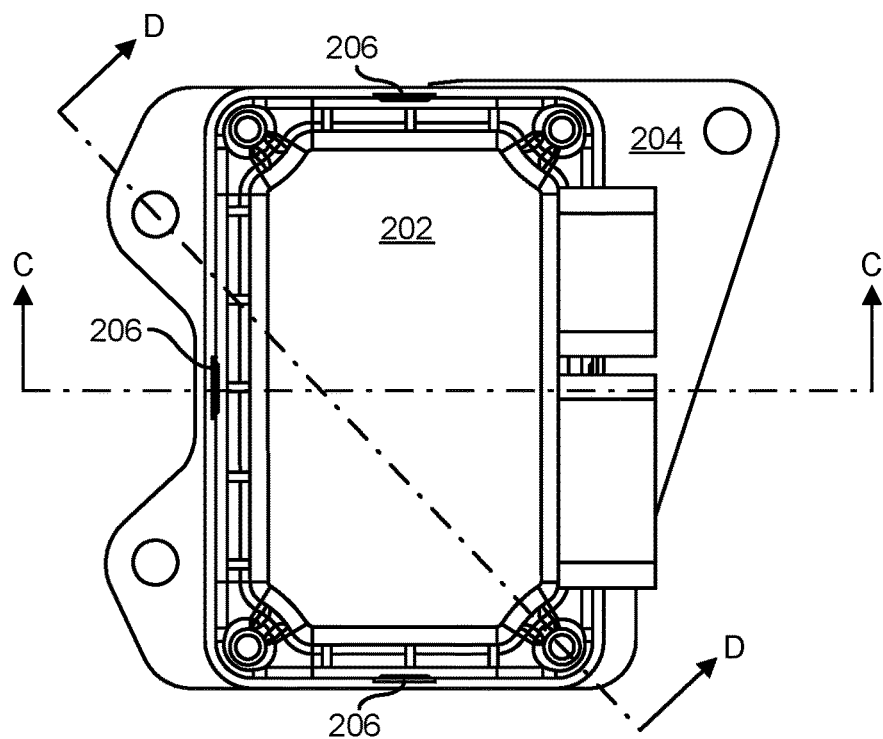
FIG. 18 is a diagram illustrating a top view of the assembled sealed electronic control module housing of FIG. 16.

Referring to FIG. 18, a diagram is shown illustrating a top view of the assembled sealed electronic control module housing 200 of FIG. 16. In various embodiments, a plurality of tabs 206 are distributed around a lower edge of the upper housing 202 to provide alignment and to provide substantially equal clamping force around a periphery of the upper housing 202. In an example, the upper housing 202 may have four side faces and each side face may have a tab 206 centrally located. However, additional tabs 206 may be implemented depending on the dimensions of a particular implementation.

Figure 19:
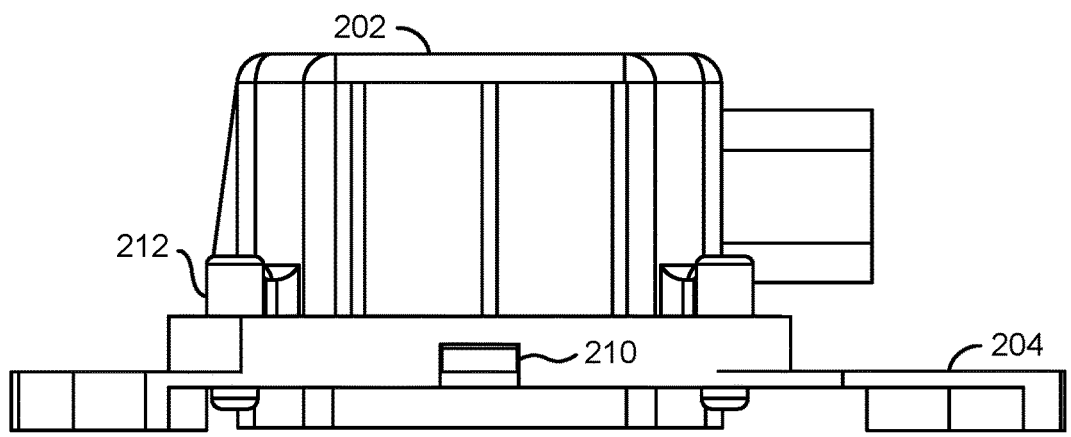
FIG. 19 is a diagram illustrating a side view of the assembled sealed electronic control module housing of FIG. 16.

Referring to FIG. 19, a diagram is shown illustrating a side view of the assembled sealed electronic control module housing 200 of FIG. 16. In various embodiments, the lower housing 204 comprises a plurality of openings 210. The openings 210 are generally located to match positions of the tabs 206 on the upper housing 202. When the upper housing 202 is assembled to the lower housing 204, the tabs 206 of the upper housing 202 engage the openings 210 of the lower housing 204 to provide the snap fit that provides a first amount of compressive force to the gasket disposed between the upper housing 202 and the lower housing 204 (not shown). The first amount of compressive force generally provides a minimum seal against fluid penetration past the gasket. In various embodiments, the first amount of compressive force provided by the snap fit may be sufficient to meet the international standards for intrusion protection (e.g., International Electrotechnical Commission (IEC) standard 60529).

Figure 20:
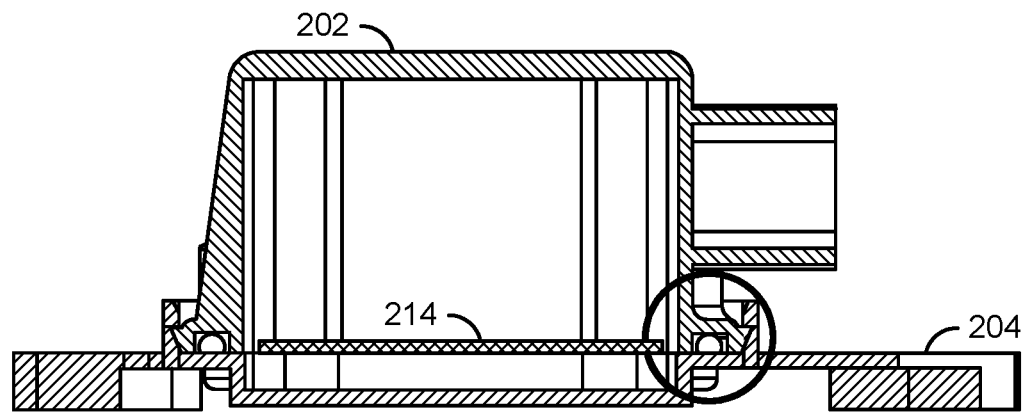
FIG. 20 is a cross-sectional view illustrating a section C-C of the assembled sealed electronic control module housing of FIG. 18 with a gasket in accordance with an example embodiment of the invention.
Figure 21:
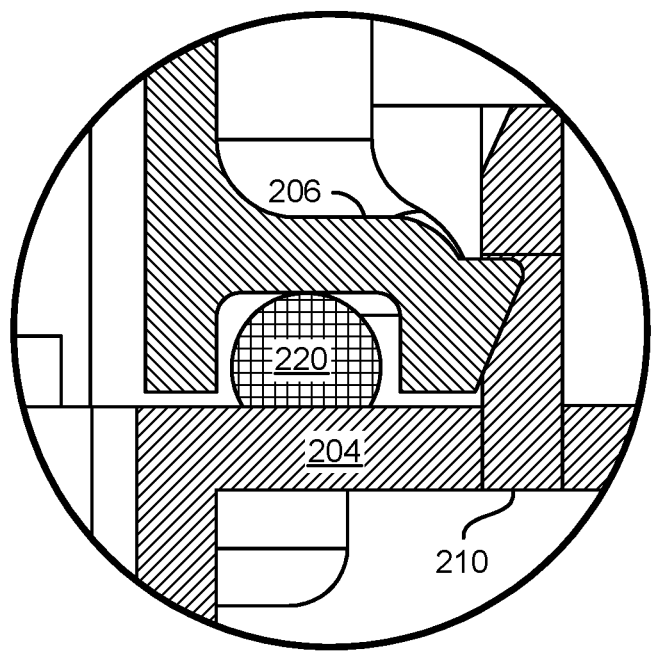
FIG. 21 is a diagram illustrating an enlarged view of a tab feature of the assembled sealed electronic control module housing of FIG. 20.

Referring to FIGS. 20 and 21, a cross-sectional view is shown illustrating a section C-C of the assembled sealed electronic control module housing 200 of FIG. 18 with a gasket in accordance with an example embodiment of the invention. In various embodiments, the sealed electronic control module housing 200 is configured to provide an enclosed sealed space in which a circuit board 212 may be securely mounted. In various embodiments, the circuit board 212 is configured to implement the circuitry of the electronic control module. In an example, the circuit board 212 may be a printed circuit board substrate having one or more integrated circuits implementing a restraint control module design. In an example, the upper housing 202 generally includes a groove in which an elastomer gasket 220 may be placed to form a seal between the upper housing 202 and the lower housing 204. When the upper housing 202, the lower housing 204, and the gasket 220 are assembled and pressed together, the tabs 206 of the upper housing 202 engage the openings 210 in the lower housing 204, locking the upper housing 202 and the lower housing 204 together and applying a first compressive force to the gasket 220.

Referring to FIG. 21, a diagram is shown illustrating an enlarged view of a tab feature of the assembled sealed electronic control module housing 200 of FIG. 20. In an example, the gasket 220 may comprise a circular cross-section. However, other gasket cross-sections may be implemented to meet design criterial of a particular implementation.

Figure 22:
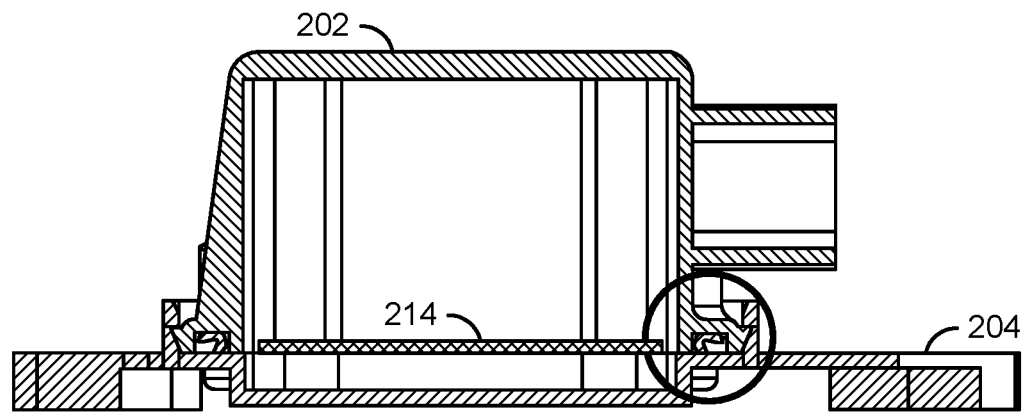
FIG. 22 is a cross-sectional view illustrating a section C-C of the assembled sealed electronic control module housing of FIG. 18 with a gasket in accordance with another example embodiment of the invention.
Figure 23:
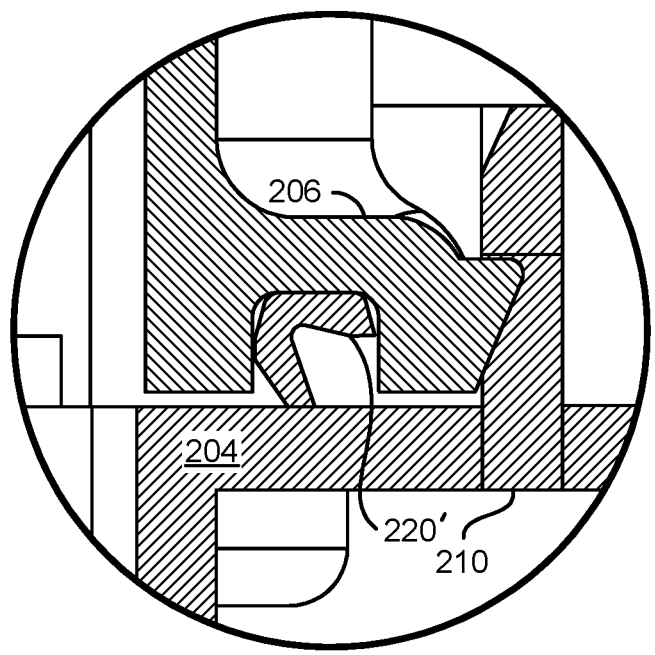
FIG. 23 is a diagram illustrating an enlarged view of a tab feature of the assembled sealed electronic control module housing of FIG. 22.

Referring to FIGS. 22 and 23, a cross-sectional view is shown illustrating a section C-C of the assembled sealed electronic control module housing 200 of FIG. 18 with a gasket in accordance with another example embodiment of the invention. In various embodiments, the sealed electronic control module housing 200 is configured to provide an enclosed sealed space in which a circuit board 212 may be securely mounted. In various embodiments, the circuit board 212 is configured to implement the circuitry of the electronic control module. In an example, the circuit board 212 may be a printed circuit board substrate having one or more integrated circuits implementing a restraint control module design. In an example, the upper housing 202 generally includes a groove in which an elastomer gasket 220' may be placed to form a seal between the upper housing 202 and the lower housing 204. When the upper housing 202, the lower housing 204, and the gasket 220' are assembled and pressed together, the tabs 206 of the upper housing 202 engage the openings 210 in the lower housing 204, locking the upper housing 202 and the lower housing 204 together and applying a first compressive force to the gasket 220'.

Referring to FIG. 23, a diagram is shown illustrating an enlarged view of a tab feature of the assembled sealed electronic control module housing 200 of FIG. 17. In an example, the gasket 220' may comprise an approximately L-shaped cross-section configured to provide a lip seal. However, other gasket cross-sections may be implemented to meet design criterial of a particular implementation.

Figure 24:
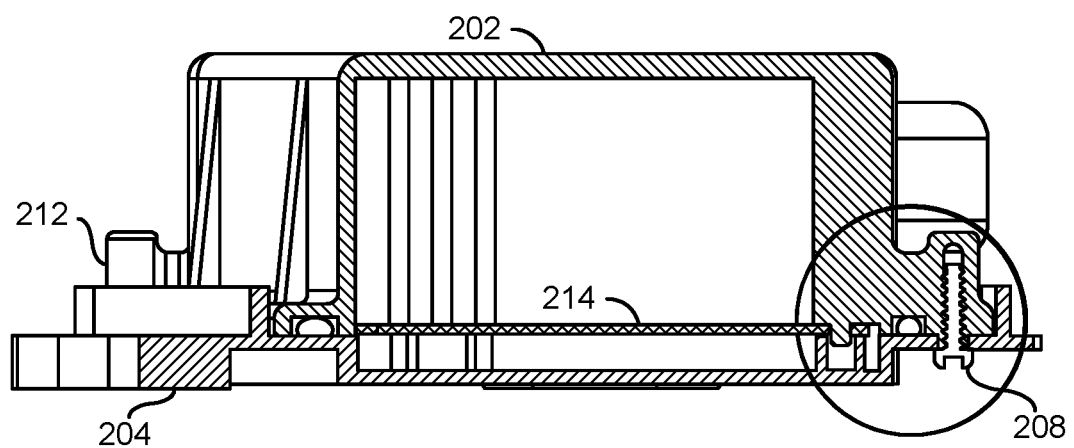
FIG. 24 is a cross-sectional view illustrating a section D-D of the assembled sealed electronic control module housing of FIG. 18.
Figure 25:
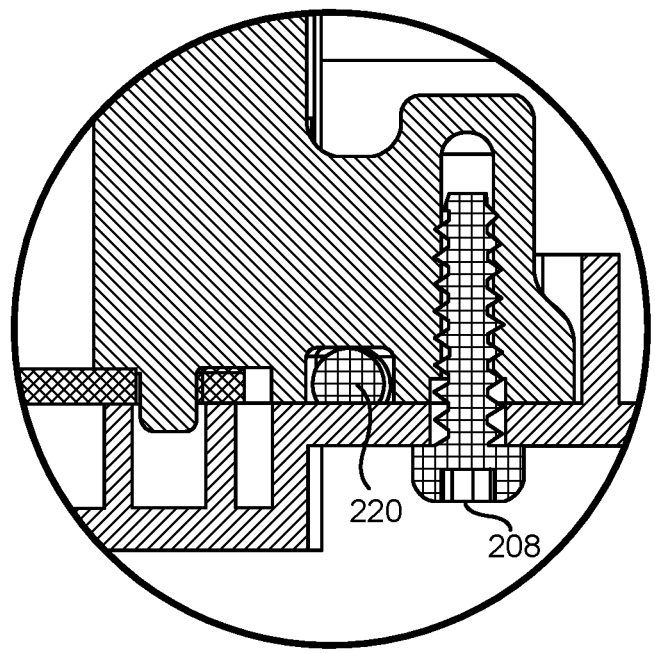
FIG. 25 is a diagram illustrating an enlarged view of a screw fastener feature of the assembled sealed electronic control module housing of FIG. 24.

Referring to FIGS. 24 and 25, a cross-sectional view is shown illustrating a section D-D of the assembled sealed electronic control module housing 200 of FIG. 18. In some embodiments, the threaded fasteners 208 are located outside the gasket 220 (or gasket 220'). In an example, the threaded fasteners 208 may be inserted through holes in the lower housing 204, through holes in the circuit board 212, and into threaded inserts in the upper housing 202. When the threaded fasteners are located outside the gasket 220, the threaded fasteners do not need to include a seal (e.g., an O-ring) to prevent fluid penetration into the sealed space within the module housing 200.

Referring to FIG. 25, a diagram is shown illustrating an enlarged view of a screw fastener feature of the assembled sealed electronic control module housing of FIG. 24.

Figure 26:
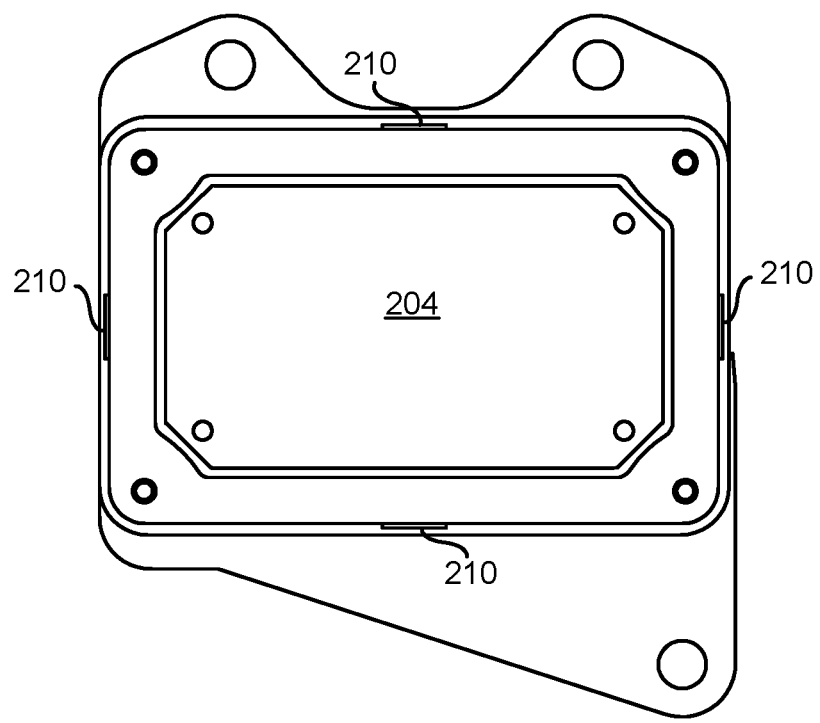
FIG. 26 is a diagram illustrating an inner surface of a lower portion of the sealed electronic control module housing of FIG. 16.

Referring to FIG. 26, a diagram is shown illustrating an inner surface of a lower portion of the sealed electronic control module housing 200 of FIG. 16. In an example, the lower housing 204 may be configured to allow the circuit board 212 to be mounted to the inner surface. In an example, the lower housing 204 may comprise a number of studs to which the circuit board 212 may be configured to be press fit. The press fit may hold the circuit board 212 in position while the sealed electronic control module housing 200 is assembled and snapped together, and the threaded fasteners are inserted and torqued.

Figure 27:
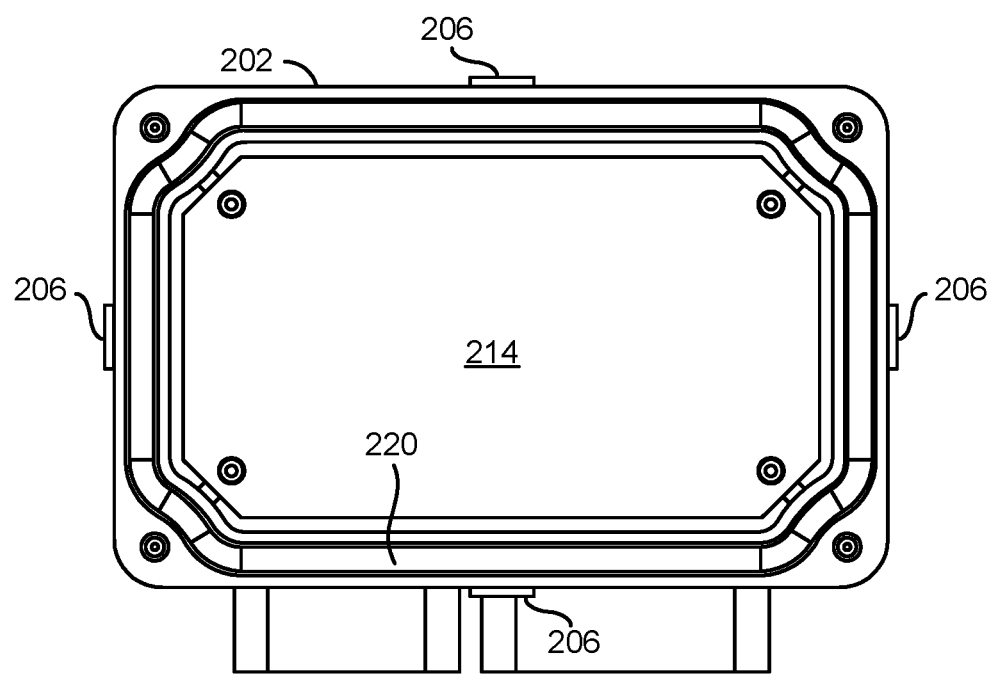
FIG. 27 is a diagram illustrating a gasket and a circuit board mounted within an upper portion of the sealed electronic control module housing of FIG. 16.

Referring to FIG. 27, a diagram is shown illustrating a gasket and a circuit board mounted within an upper portion of the sealed electronic control module housing 200 of FIG. 16. In another example, the upper housing 202 may be configured to allow the circuit board 212 to be mounted to the inside of the upper housing 202. In an example, the upper housing 202 may comprise a number of studs to which the circuit board 212 may be configured to be press fit. The press fit may hold the circuit board 212 in position in the upper housing 202 while the sealed electronic control module housing 200 is assembled and snapped together, and the threaded fasteners are inserted and torqued.

Figure 28:
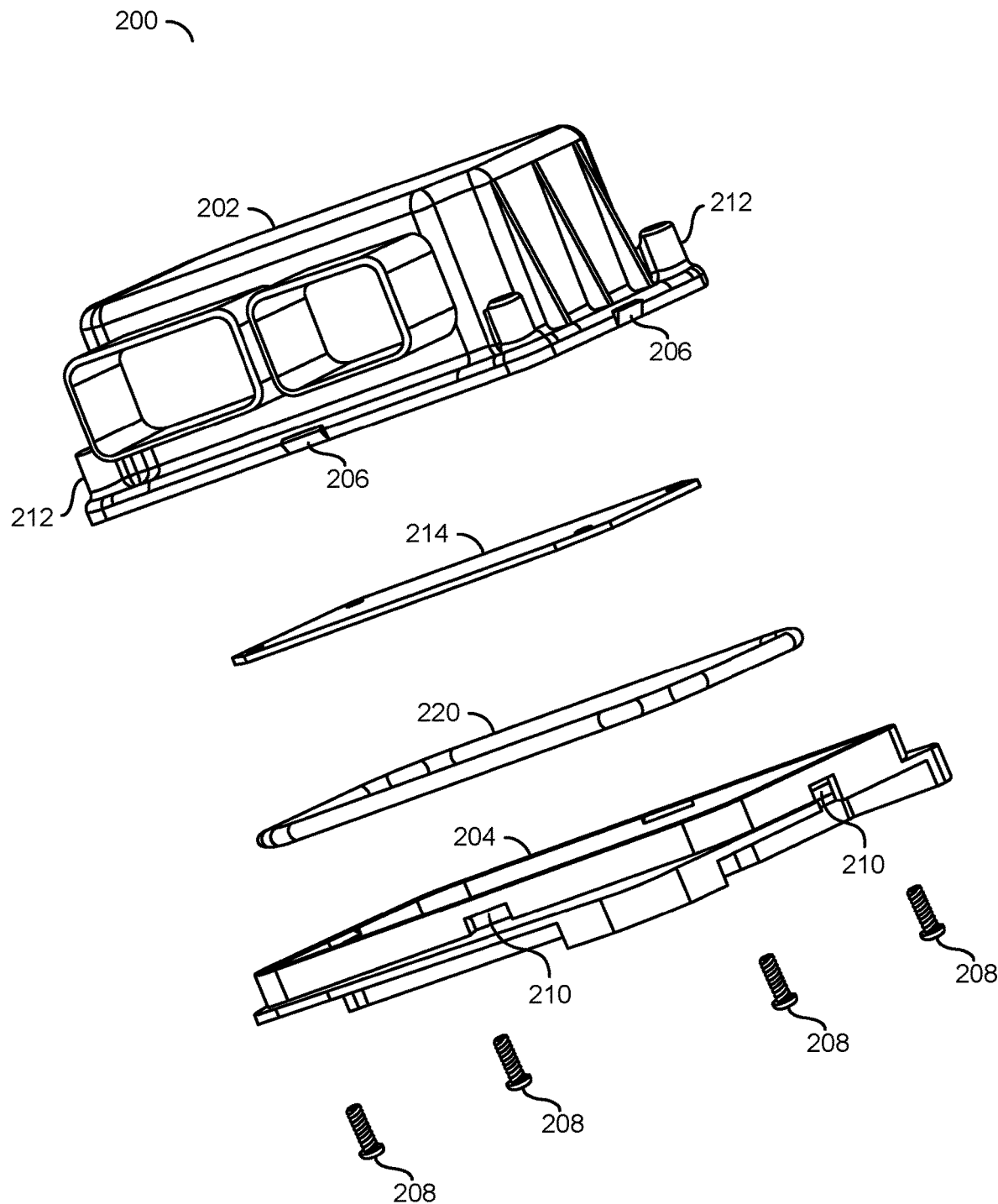
FIG. 28 is a diagram illustrating an exploded view of the sealed electronic control module housing of FIG. 16 with a circuit board.

Referring to FIG. 28, a diagram is shown illustrating an exploded view of the sealed electronic control module housing 200 of FIG. 16 with a circuit board. In an example, assembly of the sealed electronic control module housing 200 may begin by attaching the circuit board 212 to either the upper housing 202 or the lower housing 204. The gasket 220 may be placed around the circuit board 212 (e.g., in a groove in the upper housing 202). The upper housing 202 and lower housing 204 may be assembled with a snap fit to engage the tabs 206 in the openings 210 and apply a first amount of compressive force to the gasket 220. The threaded fasteners 208 may be inserted and tightened to apply a second amount of compressive force to the gasket 220. The second amount of compressive force generally perfects the seal provided by the gasket 220 within the sealed electronic control module housing 200.

Figure 29:
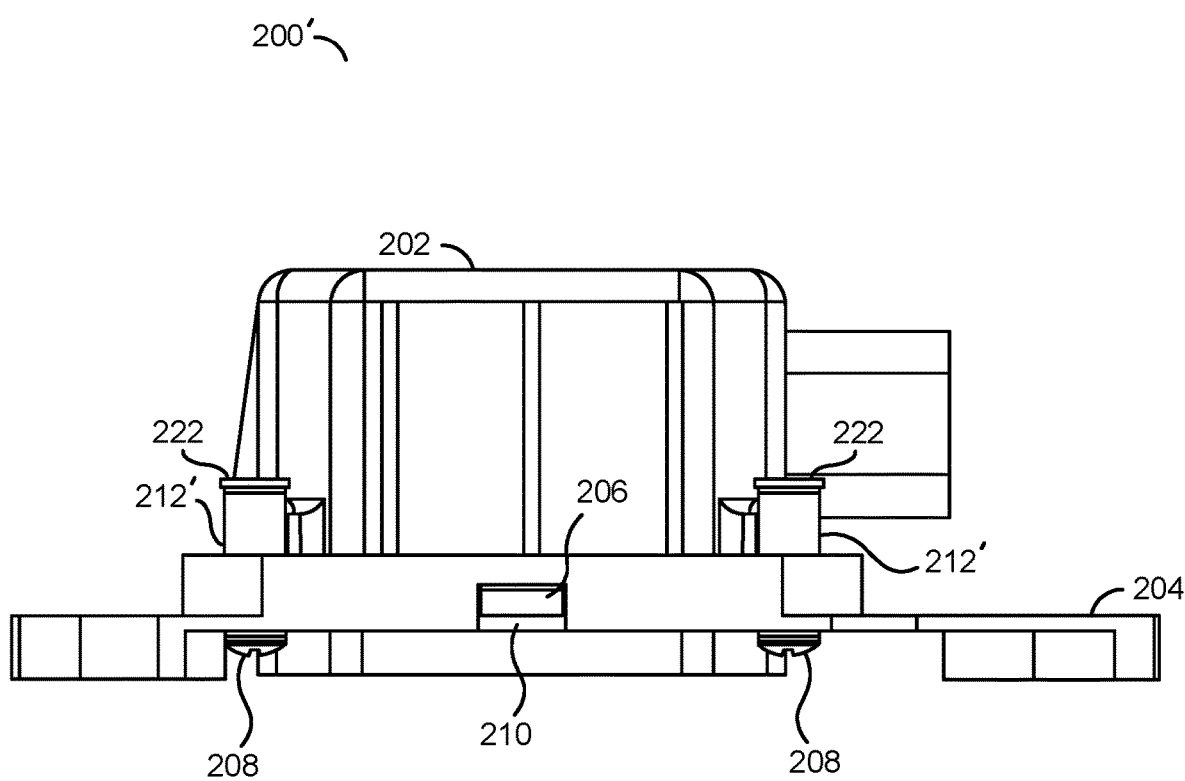
FIG. 29 is a diagram illustrating a side view of an assembled sealed electronic control module housing in accordance with another example embodiment of the invention.

Referring to FIG. 29, a diagram is shown illustrating a side view of an assembled sealed electronic control module housing 200' in accordance with another example embodiment of the invention. In an example, threaded inserts 222 may be added to the upper housing 202. The threaded fasteners 208 may be configured to be long enough to pass through the lower housing 104 and into the threaded inserts 222. The threaded inserts 222 are generally configured to allow the threaded fasteners 208 to create greater clamping force on the screw towers 212'.

Figure 30:
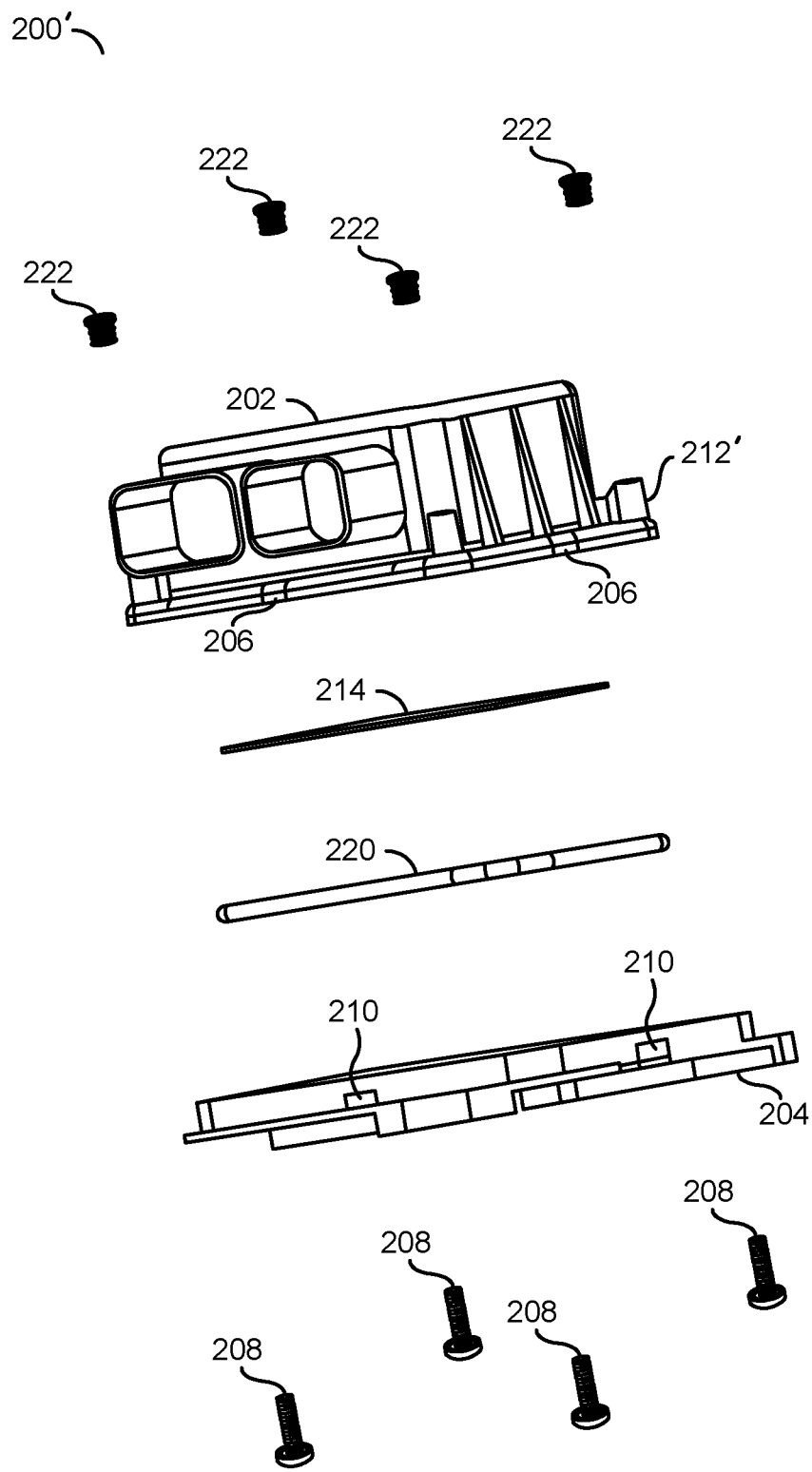
FIG. 30 is a diagram illustrating an exploded view of the sealed electronic control module housing of FIG. 29.

Referring to FIG. 30, a diagram is shown illustrating an exploded view of the sealed electronic control module housing 200' of FIG. 29. In an example, assembly of the sealed electronic control module housing 200' may begin by inserting threaded inserts 222 into screw towers 212' in the upper housing 202. The circuit board 212 may be attached to either the upper housing 202 or the lower housing 204. The gasket 220 (220') may be placed around the circuit board 212 (e.g., in a groove in the upper housing 202). The upper housing 202 and lower housing 204 may be assembled with a snap fit to engage the tabs 206 in the openings 210 and apply a first amount of compressive force to the gasket 220. The threaded fasteners 208 may be inserted and tightened to apply a second amount of compressive force to the gasket 220. The second amount of compressive force generally perfects the seal provided by the gasket 220' within the sealed electronic control module housing 200'.

Figure 31:
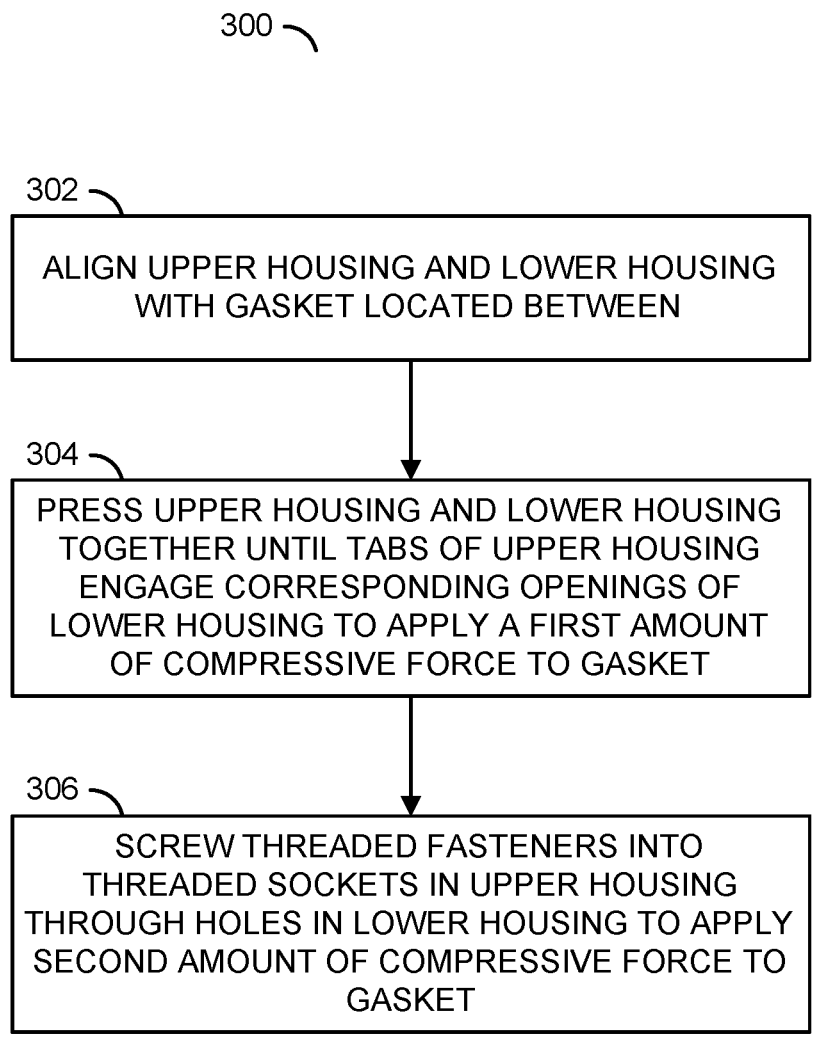
FIG. 31 is a flow diagram illustrating a manufacture process in accordance with an example embodiment of the invention.

Referring to FIG. 31, a diagram of a process 300 is shown illustrating an assembly (manufacturing) process in accordance with an example embodiment of the invention. In an example, the process (or method) 300 may comprise a step (or state) 302, a step (or state) 304, and a step (or state) 306. In the step 302, the process 300 may align an upper housing and a lower housing with a gasket placed there between for assembly together. The upper housing may comprise a plurality of tabs and a plurality of threaded sockets and the lower housing may comprise a plurality of openings configured to engage the tabs of the upper housing and a plurality of holes configured to align with the plurality of threaded sockets when assembled to the upper housing. In the step 304, the process 300 may press the upper housing and the lower housing together until the tabs of the upper housing engage the openings in the lower housing. Pressing the upper housing and the lower housing together generally creates a snap fit the applies a first amount of compressive force to the gasket. The snap fit also holds the upper housing, the lower housing, and the gasket in a predetermined alignment for subsequent assembly steps (if implemented). In the step 306, the process 300 may screw threaded fasteners into the threaded sockets of the upper housing through the holes in the lower housing to apply a second amount of compressive force to the gasket. The second amount of compressive force generally perfects a seal provided by the gasket between the upper and lower housings.

As described above, the gasket generally functions to (when compressed in the assembly) create a seal between components (typically a housing and baseplate). Placing assembly screws outside the gasket avoids the need to seal the screws. Molding or otherwise incorporating a connector or connectors as part of the enclosure (housing) eliminates the need for sealing the connector/housing interface. Conventional sealed modules use a radially compressed sealed Restraint Control Module design which is limited to an all plastic module. In contrast, in various embodiments of the invention an axial or face seal design is implemented, which may be used with a metal baseplate or cover and fasteners/snap fit to create a clamping force.

In some embodiments of the invention, the fasteners may be located outside the seal as described above. An alternate embodiment of the invention locates the fasteners inside the seal to improve the clamping of the PCB 112 to the enclosure. Embodiments placing the fasteners inside the gasket may have a potential advantage of improving mechanical transfer function performance, at a cost, however, of the fasteners needing to also be sealed. The invention also may eliminate a need for dispensing sealants and/or adhesives, which may be undesirable in the manufacturing process. Preliminary testing has indicated superior seal performance (e.g., IP67 rating) over conventional seal performance (e.g., IP54 rating).

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
    an upper housing comprising a plurality of tabs and a plurality of threaded sockets, wherein said tabs comprise a wedge-shaped portion;
    a gasket; and
    a lower housing comprising a plurality of openings configured to engage the tabs of the upper housing and a plurality of holes configured to align with the plurality of threaded sockets when assembled to the upper housing, wherein when said upper housing is assembled to said lower housing, (a) each wedge-shaped portion of said plurality of tabs (i) extends through a respective one of said plurality of openings to outside of said lower housing and (ii) engages said lower housing to provide a snap fit that provides a clamping force which holds the upper housing, the lower housing and the gasket in a predetermined alignment and applies a first amount of compressive force to the gasket, and (b) threaded fasteners are screwed into the threaded sockets of the upper housing through the holes in the lower housing, applying a second amount of compressive force to the gasket.

2. The apparatus according to claim 1, wherein said first amount of compressive force provides a minimum seal against fluid penetration past the gasket.

3. The apparatus according to claim 1, wherein said second amount of compressive force perfects a seal against fluid penetration past the gasket.

4. The apparatus according to claim 3, wherein said second amount of compressive force provides a seal against fluid penetration past the gasket that is compliant with at least one automotive standard for sealed control modules.

5. The apparatus according to claim 1, wherein said gasket is comprised of at least one of nitrile rubber or silicone rubber.

6. The apparatus according to claim 1, wherein said gasket comprises a material having a durometer rating in a range from 30 to 100.

7. The apparatus according to claim 1, wherein said gasket comprises a circular cross-section.

8. The apparatus according to claim 1, wherein said gasket comprises an approximately L-shaped cross-section.

9. The apparatus according to claim 1, wherein said gasket is molded onto a lower edge of said upper housing.

10. A sealed restraint control module comprising:
    an upper housing comprising a plurality of tabs and a plurality of threaded sockets, wherein said tabs comprise a wedge-shaped portion;
    a gasket; and
    a lower housing comprising a plurality of openings configured to engage the tabs of the upper housing and a plurality of holes configured to align with the plurality of threaded sockets when assembled to the upper housing, wherein when said upper housing is assembled to said lower housing, (a) each wedge-shaped portion of said plurality of tabs (i) extends through a respective one of said plurality of openings to outside of said lower housing and (ii) engages said lower housing to provide a snap fit that provides a clamping force which holds the upper housing, the lower housing and the gasket in a predetermined alignment and applies a first amount of compressive force to the gasket, and (b) threaded fasteners are screwed into the threaded sockets of the upper housing through the holes in the lower housing, applying a second amount of compressive force to the gasket.

11. The sealed restraint module according to claim 10, wherein the gasket comprises either a circular cross-section or an approximately L-shaped cross-section.

12. The sealed restraint control module according to claim 10, wherein said first amount of compressive force provides a minimum seal against fluid penetration past the gasket.

13. The sealed restraint control module according to claim 10, wherein said second amount of compressive force perfects a seal against fluid penetration past the gasket.

14. A method of assembling a sealed control module housing, the method comprising the steps of:
aligning an upper housing and a lower housing with a gasket placed between for assembly together, wherein said upper housing comprises a plurality of tabs and a plurality of threaded sockets, said plurality of tabs comprise a wedge-shaped portion, and said lower housing comprises a plurality of openings configured to engage the tabs of the upper housing and a plurality of holes configured to align with the plurality of threaded sockets when assembled to the upper housing;
pressing the upper housing and the lower housing together until each wedge-shaped portion of the plurality of tabs of the upper housing extends through a respective one of the plurality of openings to outside of the lower housing and engages the lower housing to provide a snap fit that applies a first amount of compressive force to the gasket and holds the upper housing, the lower housing, and the gasket in a predetermined alignment; and
screwing threaded fasteners into the threaded sockets of the upper housing through the holes in the lower housing to apply a second amount of compressive force to the gasket.

15. The method according to claim 14, wherein said first amount of compressive force provides a minimum seal against fluid penetration past the gasket.

16. The method according to claim 15, wherein said second amount of compressive force perfects the seal against fluid penetration past the gasket.

17. The method according to claim 14, wherein said second amount of compressive force provides a seal against fluid penetration past the gasket that is compliant with at least one automotive standard for sealed control modules.

18. The method according to claim 14, wherein said gasket is comprised of at least one of nitrile rubber or silicone rubber.

19. The method according to claim 14, wherein said gasket comprises a material having a durometer rating in a range from 30 to 100.

20. The method according to claim 14, wherein said gasket is molded onto a lower edge of said upper housing.

* * * * *